(12) United States Patent
Ziadeh et al.

(10) Patent No.: US 10,681,851 B2
(45) Date of Patent: Jun. 9, 2020

(54) PICK AND PLACE TOOLING WITH ADJUSTABLE NOZZLE CONFIGURATION

(71) Applicant: Intel Corporation, Santa Clara, CA (US)

(72) Inventors: Bassam Mohammed Ziadeh, Gilbert, AZ (US); Alin Ila, Phoenix, AZ (US); Nathan P. Heckathorne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 323 days.

(21) Appl. No.: 15/629,908

(22) Filed: Jun. 22, 2017

(65) Prior Publication Data

US 2018/0376631 A1    Dec. 27, 2018

(51) Int. Cl.
| | |
|---|---|
| *B23P 19/00* | (2006.01) |
| *H05K 13/04* | (2006.01) |
| *G01R 31/26* | (2020.01) |
| *H05K 3/32* | (2006.01) |
| *B25J 15/00* | (2006.01) |
| *B25J 15/06* | (2006.01) |
| *G01R 31/28* | (2006.01) |

(Continued)

(52) U.S. Cl.
CPC .......... *H05K 13/0404* (2013.01); *B23P 19/00* (2013.01); *B25J 15/0061* (2013.01); *B25J 15/0616* (2013.01); *G01R 31/26* (2013.01); *G01R 31/2867* (2013.01); *H05K 3/32* (2013.01); *H05K 13/041* (2018.08); *H05K 13/0409* (2018.08); *B25J 15/0683* (2013.01); *G01R 31/2642* (2013.01); *H01L 21/67144* (2013.01); *H01L 21/6838* (2013.01); *Y10T 29/53174* (2015.01)

(58) Field of Classification Search
CPC .......... H01L 21/6838; Y10T 29/53191; Y10T 29/4913; Y10T 29/53174; Y10T 29/53417; Y10T 29/49124; H05K 13/0404
USPC .................. 29/739, 428, 729, 743, 757, 832
See application file for complete search history.

(56) References Cited

U.S. PATENT DOCUMENTS

| | | | |
|---|---|---|---|
| 5,953,812 A | 9/1999 | Ferrante | |
| 6,979,032 B2 * | 12/2005 | Damhuis | B25J 15/0052 294/185 |

(Continued)

OTHER PUBLICATIONS

US 5,184,047 A1, 02/2001, Shekar et al. (withdrawn)

*Primary Examiner* — Thiem D Phan
(74) *Attorney, Agent, or Firm* — Patent Capital Group

(57) ABSTRACT

Described herein are pick and place devices having reconfigurable nozzle subassemblies, as well as related devices and methods. In some embodiments, a pick and place device may have a reusable base plate, and a plurality of reusable vacuum nozzle subassemblies that are removably coupled to the base plate in a first configuration. In some embodiments, plurality of vacuum nozzle subassemblies may be removed, then removably re-coupled to the base plate in a second configuration. In some embodiments, a pick and place device may include a base plate, a plurality of nozzle subassemblies removably attached to the base plate, where individual nozzle subassemblies include a vacuum nozzle, a vacuum connection, and a base; and a top plate coupled to the base plate, where the top plate includes a plurality of openings configured to seat the plurality of nozzle subassemblies.

7 Claims, 6 Drawing Sheets

(51) Int. Cl.
*H01L 21/67* (2006.01)
*H01L 21/683* (2006.01)

(56) References Cited

U.S. PATENT DOCUMENTS

| | | | |
|---|---|---|---|
| 7,950,708 B2* | 5/2011 | Parnell | B25J 15/0052 |
| | | | 294/2 |
| 9,586,325 B2* | 3/2017 | Truyens | B25J 15/0052 |
| 2003/0182796 A1* | 10/2003 | Nieves | H05K 13/0409 |
| | | | 29/832 |
| 2015/0173260 A1 | 6/2015 | Gieskes et al. | |
| 2016/0227682 A1* | 8/2016 | Matsuda | H05K 13/0409 |
| 2017/0120452 A1 | 5/2017 | Truyens | |

* cited by examiner

PICK AND PLACE TOOLING WITH ADJUSTABLE NOZZLE CONFIGURATION

FIELD

This disclosure relates generally to the field of fabrication and testing of integrated circuit devices using pick and place tooling and, in particular, methods and apparatuses for a pick and place head.

BACKGROUND

The demand for higher performance electronic devices, including integrated circuits or semiconductor chips, at a lower cost is requiring more precise and higher-throughout manufacturing. Trays holding arrays of components, where each component is placed in an individual cell within the array, are used for transport and handling during fabrication and testing. The components are removed from and replaced in the tray by a "pick and place" device. A pick and place device typically has multiple vacuum grippers or nozzles, arranged in rows and columns, to pick up and to place a plurality of components. The pitch or spacing between the cells in the array may vary between different tray types and may vary depending on the component and the product being manufactured. Traditional pick-and-lace heads have fixed nozzle placement and fixed vacuum connections that are tapped and drilled into a solid base plate. Other pick and place devices have multiple nozzles mounted on a horizontal bar, and multiple horizontal bars stacked vertically, where the pitch may be adjusted by moving the nozzles along the horizontal bar and by moving the multiple horizontal bars vertically.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. The accompanying drawings are not necessarily drawn to scale. Furthermore, some conventional details have been omitted so as not to obscure from the inventive concepts described herein.

DETAILED DESCRIPTION

Figure 1:
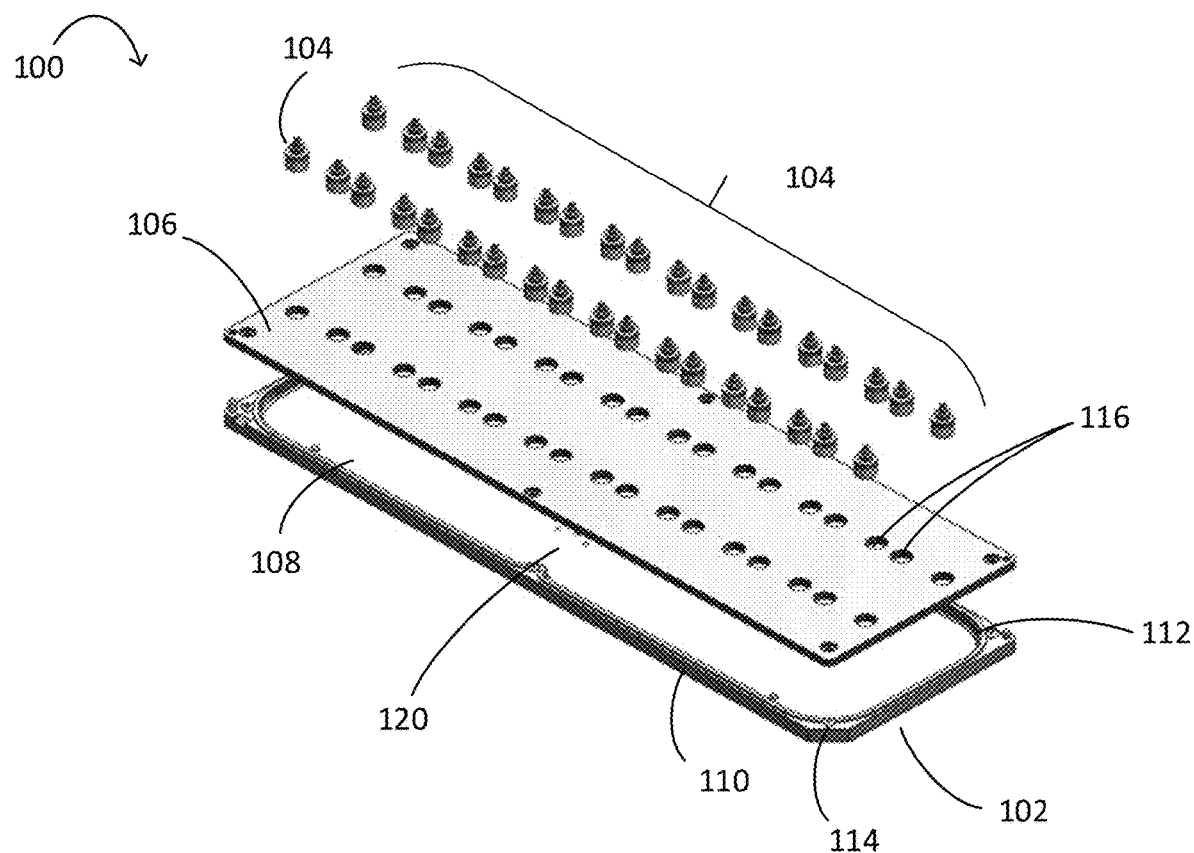
FIG. 1 is a schematic illustration of an exploded view of an exemplary pick and place head having an adjustable configuration, according to some embodiments of the present disclosure.

Pick and place devices having reconfigurable nozzle subassemblies, as well as related devices, and methods, are disclosed herein. More specifically, a pick and place device may have a reusable base plate, and a plurality of reusable vacuum nozzle subassemblies that are removably coupled to the base plate are disclosed herein. In some embodiments, a pick and place device may have a reusable base plate, and a plurality of reusable nozzle subassemblies removably coupled to the base plate in a first configuration. In some embodiments, the plurality of vacuum nozzle subassemblies may be removed from the base plate, then removably re-coupled to the base plate in a second configuration. In some embodiments, a pick and place device may have a reusable base plate, a plurality of reusable nozzle subassemblies, and a readily manufactured top plate. In some embodiments, a pick and place device may include a base plate, a plurality of nozzle subassemblies removably attached to the base plate, the individual nozzle subassemblies including a base, a vacuum connection, and a vacuum nozzle, and a top plate coupled to the base plate, the top plate including a plurality of openings configured to seat the plurality of nozzle subassemblies. In some embodiments, the top plate may include a plurality of indentations, etchings, scorings, or other indicators, rather than openings, for identifying the placement or configuration of the individual nozzle subassemblies to the top plate, where the individual nozzle subassemblies are removably coupled to the top plate. In some embodiments, the individual nozzle subassemblies may be removably attached by a magnet. In some embodiments, the base plate and top plate may be coupled to define an internal cavity that may be connected to a vacuum and may function as a vacuum chamber for operating the vacuum nozzles in the plurality of nozzle subassemblies. In some embodiments, the base plate may be a solid material with bored vacuum channels that may be coupled to the nozzle subassemblies for operating the vacuum nozzles.

In the following detailed description, various aspects of the illustrative implementations are described using terms commonly employed by those skilled in the art to convey the substance of their work to others skilled in the art. For example, as used herein, "nozzle subassembly," vacuum nozzle subassembly," and "subassembly," may be used interchangeably.

Throughout the specification, and in the claims, the term "connected" or "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The terms "left," "right," "front," "upper," "lower," "back," "top," "bottom," "over," "under," "on," "between," and the like in the description and in the claims, if any, are used for descriptive purposes and not necessarily for describing permanent relative positions. As used herein, the term "thickness" refers to a dimension of a certain element or layer as measured along the z-axis, the term "width" refers to a dimension of a certain element or layer as measured along the y-axis, while the term "length" refers to a dimension of a certain element or layer as measured along the x-axis.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Pick and place devices are automated devices designed to attach one or more work pieces and move them from operation-to-operation within a manufacturing and/or testing line. As most pick and place devices have fixed nozzles for attaching the work piece, a new pick and place device must be designed and fabricated for a new work piece. The pick and place device may be designed based on the dimensions of the work piece as the outer edges of the work piece usually define the nozzle placement, and based on the space provided for moving the work pieces within the manufacturing or testing operation. The pick and place device may include additional features, such as extendable arms and rotating platforms, to move and place the work pieces from operation to operation. The pick and place device may include one or more pick and place heads, where the pick and place head is designed to attach a nozzle or suction cup to the fixed outer dimensions of a work piece, usually the four corners, apply a vacuum to each nozzle to pick up the work piece, move the work piece to the next stage or operation, which may include placing the work piece at a processing stage, such as a chip-attach stage, or may include placing the work piece into a tray, such as a JEDEC tray, and release the work piece by removing vacuum. A pick and place head may be designed to move a plurality of work pieces at a time, depending on the pitch, the form factor of the work piece, and the density of the originating or receiving tray. Generally, pitch is the distance between any two adjacent things in a series, such as the distance between work pieces, and may be measured, for example, from the center-point of one work piece to the center-point of a second or next work piece. A tray array having two rows of six work pieces, the pitch may be the row to row spacing in the Y direction and the column to column spacing in the X direction (e.g., for a 2 by 6 tray array, the Y pitch may be 61 mm and the X pitch may be 50 mm). The pitch may be any dimension and usually changes from tray to tray and from work piece to work piece. The dimensions of the work piece are the form factor. The form factor generally refers to the X and Y dimensions of a work piece as most work pieces are typically a square or a rectangle (e.g., a work piece that is 35 mm square will have a 35 mm by 35 mm form factor). The form factor dictates the density of the tray (e.g., number of rows and columns in a tray for moving work pieces). For example, a "9-up" pick and place head may be designed with 36 nozzles to move one row of nine work pieces at a time. In another example, a pick and place head may be designed to move eight work pieces at a time where the density of the tray may be one row of eight or two rows of four, and 32 nozzles may be configured according to the pitch, the form factor of the work piece, and density of the tray. Typically, a pick and place head is designed specifically for the fixed-dimension of the particular work piece and is usually a block of solid metal with bored vacuum channels to align with drilled and tapped holes for permanently connecting the vacuum nozzles. For each pick and place head, the individual holes are drilled and tapped based on the pitch, the form factor, the tray density, and/or the movable area for the pick and place device, then, internal vacuum channels are bored out to connect each nozzle with the main vacuum. Each new work piece dimension and/or tray density configuration demands a new pick and place head and new nozzles, which are costly and may require a long lead time, possibly a couple of months, for fabrication. An improved pick and place head that is more configurable, more cost-effective, and more quickly fabricated is desired.

The pick and place devices disclosed herein have reconfigurable nozzles to meet the requirements for varying the pitch, the form factor, and/or the tray density that are more easily manufactured and less costly. Various ones of the pick and place devices described herein provide for an improved pick and place head having an adjustable nozzle configuration with a reduced fabrication time. In particular, some of the embodiment disclosed herein provide for a pick and place head having a reusable base plate, a customizable top plate that may be readily fabricated, and a plurality of reusable nozzle subassemblies that may be reconfigured in conjunction with the customizable top plate.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

FIG. 1 is a schematic illustration of an exploded view of an exemplary pick and place head 100 having an adjustable nozzle subassembly configuration, according to some embodiments of the present disclosure. Assembly 100 may include a base plate 102, a plurality of vacuum nozzle subassemblies 104, and a top plate 106. The plurality of vacuum nozzle subassemblies 104 may be removably attached to base plate 102. Base plate 102 and vacuum nozzle subassemblies 104 may be designed to be reusable.

Base plate 102 may be any suitable size and shape, and may be made of any suitable material. For example, base plate 102 may be designed based on desired usage, for example, work piece dimensions (i.e., form factor), pick and place head dimensions, pitch, tray density, and number of heads on the pick and place device, among others. For example, in some embodiments, base plate 102 may have dimensions ranging from 20 mm by 20 mm by 8 mm to 100 mm by 300 mm by 20 mm, where the dimensions are length by width by height or thickness. Base plate 102 may be made of any material, or combination of materials, having the desired properties for reusability, durability, magnetization, and low cost, such as steel, stainless steel, and aluminum, among others.

As shown in FIG. 1, base plate 102 may be rectangular-shaped with four sidewalls 110 surrounding a hollow internal rectangle 108 with rounded corners and a seal 112 along the top edge of the internal rectangle. Base plate 102 may include one or more connections for a vacuum source 120, such that the empty area in the base plate 102 defined by the top plate 106 may function as a vacuum chamber for operating the vacuum subassemblies 104.

Top plate 106 may include a plurality of openings 116 for seating the plurality of nozzle subassemblies 104. Top plate 106 may be configured such that the layout matches the pitch, the form factor, the tray density, and/or other requirements for a specific work piece and tray. For example, as shown in FIG. 1, top plate 106 has a 9-up configuration with two rows of eighteen openings, where the openings when grouped in fours are spaced to form four points of a square. Top plate 106 may be of any suitable size and shape, and may be designed to be compatible with base plate 102. Top plate 106 may be made of any suitable material, or combination of materials, having the desired properties for ease of manufacture, and low cost, including aluminum, plastic, or cardboard, among others. Top plate 106 may be coupled to base plate 102 using any suitable means, such as screws 114, fasteners, latches, epoxy, adhesive, or the like. Vacuum subassemblies 104 may be seated in the configured openings 116 in top plate 106 and may attach to base plate 102.

Figure 2:
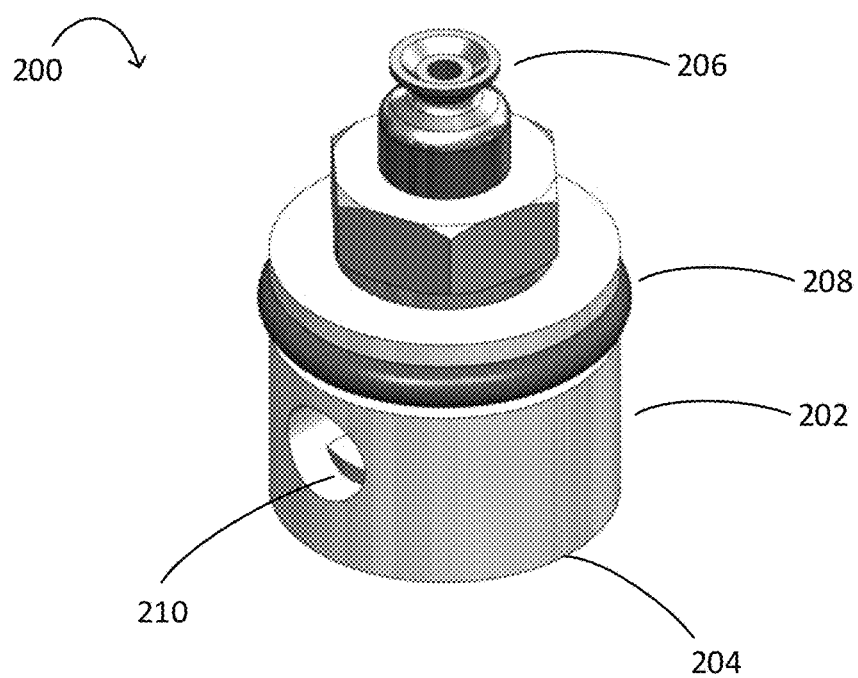
FIG. 2 is a schematic illustration of an exemplary reusable vacuum subassembly, according to some embodiments of the present disclosure.

FIG. 2 is a more detailed schematic illustration of an exemplary reusable vacuum subassembly 104 of FIG. 1, according to some embodiments of the present disclosure. As shown in FIG. 2, each of the individual vacuum subassemblies 200 (identified as 104 in FIG. 1) may include a base 202, a vacuum nozzle or suction cup 206 that is operated by applying a vacuum, and, optionally, a seal 208 for maintaining an internal vacuum chamber. The vacuum nozzle subassemblies may be removably attached to the base plate. As described herein, "removably attached," "removably coupled," and similar terms may be used interchangeably, and refer to connecting two components together in a way that allows for disconnecting the two components easily and without causing damage.

Base 202 may be any suitable size and shape, and may be based on, for example, the dimensions of base plate 102, top plate 106, and the size of vacuum nozzle 206. For example, base 202 may be cylindrical, as shown in FIG. 2, such that the subassembly 104 has only one position for seating in top plate 106. In some embodiments, base 202 may be 5-10 mm in diameter. In some embodiments, base 202 may be 5-25 mm in diameter. In some embodiments, base 202 may have an opening 210 that is exposed to the vacuum chamber defined by the base plate and the top plate. In some embodiments, base 202 may have a hose barb to connect the subassembly to a vacuum channel, as described with respect to FIG. 5 below. Base 202 may be made of any suitable material, or combination of materials, having the desired properties for durability, functionality, and low cost, such as steel, stainless steel, and aluminum, among others.

Subassembly 200 may be removably attached to base plate 102 using any suitable attachment having the desired properties that allows for readily attaching subassembly 200 to base plate 102 as well as removing. In some embodiments, the base 202 of the subassembly 200 may include a magnet 204 housed within the base or on the bottom surface of the base (not visible in FIG. 2) that enables the subassembly to be attached to a base plate 102 having magnetic properties. In some embodiments, the subassembly may be removably attached using, for example, adhesive, Velcro, press fit fastener, a plunger fastener, and the like. In some embodiments, subassembly 200 may be removably attached to the top plate. In some embodiments, subassembly 200 may be removably attached to the top plate and the base plate. In some embodiments, more than one way of attaching the subassembly may be used, for example, a subassembly may be attached to the base plate by a magnet and may be attached to the top plate by threads that enable the subassembly to be screwed into the top plate opening.

Vacuum nozzle 206 may be any suitable size and shape having the desired properties for picking up and moving a work piece using a vacuum without dropping or causing other damage to the work piece. In some embodiments, vacuum nozzle 206 may include a suction cup that functions by applying a vacuum to attach a work piece, where the suction cup has dimensions ranging from 1 mm to 5 mm in diameter. In some embodiments, the suction cup diameter may range from 1.5 mm to 3.5 mm. Vacuum nozzle 206 may be made of any suitable material having the properties for attachment, minimal surface interface (i.e., soft and light touch), flexibility, durability, and functionality. In some embodiments, vacuum nozzle 206 may be made of rubber, PVC plastic, neoprene, poly ether ether ketone (PEEK), Teflon (PTEF), Viton, or silicone, among other materials. Vacuum nozzle 206 may be attached to base 202 by any suitable means, including mechanical, such as by nuts and bolts, or solder, among others.

Vacuum subassembly 200 may optionally include a seal 208 for forming a seal between base 202 and top plate 106 such that the vacuum chamber is maintained. Seal 208 may be any suitable size and shape and may be made of any suitable material for creating a seal, including, for example, an O-ring, washer, or surface seal made from rubber, adhesive, silicone, or the like. Base 202 may include opening 210, which connects the nozzle to the vacuum chamber created between the top plate and base plate, for operating the nozzle with the vacuum.

Vacuum subassembly 200 is universally adjustable and reusable as the vacuum subassembly is not permanently affixed to base plate 102 or attached to a permanent vacuum connection. For example, vacuum subassembly may be removed and relocated on the base plate based on a different top plate configuration, as described herein, such that the configuration may be readily changed.

Figure 3:
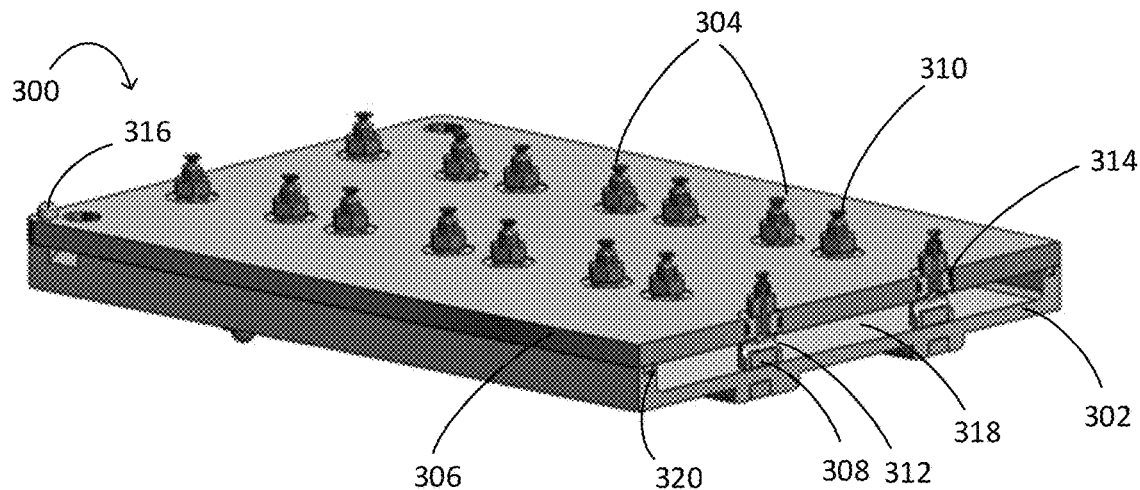
FIG. 3 is a schematic illustration of a cross-section cut away view of an exemplary reconfigurable pick and place head, according to some embodiments of the present disclosure.

FIG. 3 is a schematic illustration of a cross-section cut away view of the exemplary pick and place head of FIG. 1 having an adjustable configuration, according to some embodiments of the present disclosure. FIG. 3 illustrates pick and place head assembly 300. As shown, assembly 300 includes reusable base plate 302, a plurality of reusable vacuum nozzle subassemblies 304, and top plate 306. Top plate 306 is coupled to base plate 302, for example, using one or more screws 316 and sealed by seal 320 to create vacuum chamber 318. Top plate 306 has a plurality of openings for seating the vacuum nozzle subassemblies 304. Each vacuum subassembly 304 includes a base with vacuum connection 312, vacuum nozzle 310, and a seal 314, which as shown is an O-ring. As shown, each individual vacuum subassembly 304 is placed in a top plate opening and is removably attached to base plate 302 via magnet 308. Vacuum connection 312 is exposed to vacuum chamber 318 and seal 314 seals the interface between the subassembly and top plate to maintain the vacuum chamber. Vacuum may be applied through vacuum connections on base plate 302 (not shown) to operate the vacuum nozzles.

Figure 4:
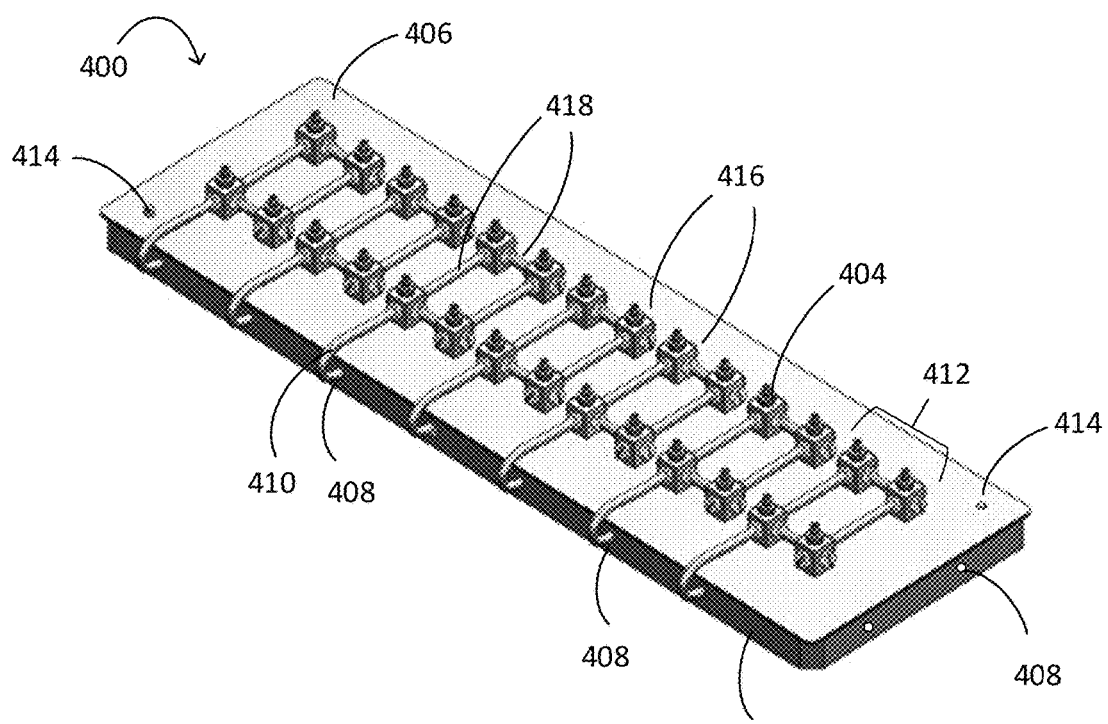
FIG. 4 is a schematic illustration of another exemplary pick and place head having an adjustable configuration, according to some embodiments of the present disclosure.

FIG. 4 is a schematic illustration of another exemplary pick and place head having an adjustable configuration, according to some embodiments of the present disclosure. Assembly 400 may include a base plate 402, a plurality of vacuum nozzle subassemblies 404, and a top plate 406. Base plate 402 and vacuum nozzle subassemblies 404 may be designed to be reusable. Base plate 402 and top plate 406 may be any suitable size and shape, and may be made of any suitable material, as described above with respect to FIG. 1.

As shown in FIG. 4, base plate 402 may be a solid material having channels bored through the base to form vacuum channels 408. Vacuum channels 408 may be connected to a vacuum source (not shown) and vacuum subassemblies 404 via piping, hosing, or tubing 410, 418. In some embodiments, as shown in FIG. 4, top plate 406 may include a plurality of openings 416 for seating the plurality of nozzle subassemblies 404, which may be removably coupled to base plate 402. For example, as shown in FIG. 4, top plate 406 has a 7-up configuration with two rows of fourteen openings, where the openings are grouped in fours 412. In some embodiments, top plate 406 may have impressions, indentations, etchings, scorings, or other indicators, not openings, for identifying subassembly placement on and removable attachment to the top plate rather than the base plate. Top plate 406 may be coupled to base plate 402 using any suitable means, such as screws 414, fasteners, latches, magnets, or the like. As shown in FIG. 4, the vacuum of nozzle subassemblies 404 may be interconnected by tubing 410, 418, then connected to a common vacuum channel 408. While the vacuum channels are not adjustable, the vacuum connections are adjustable and may be configured according to, for example, pitch and form factor requirements, among others. Although FIG. 4 shows vacuum connections for nozzle subassemblies grouped by fours, it will be understood that the vacuums of any number of subassemblies may be grouped to optimize performance and functionality.

Figure 5:
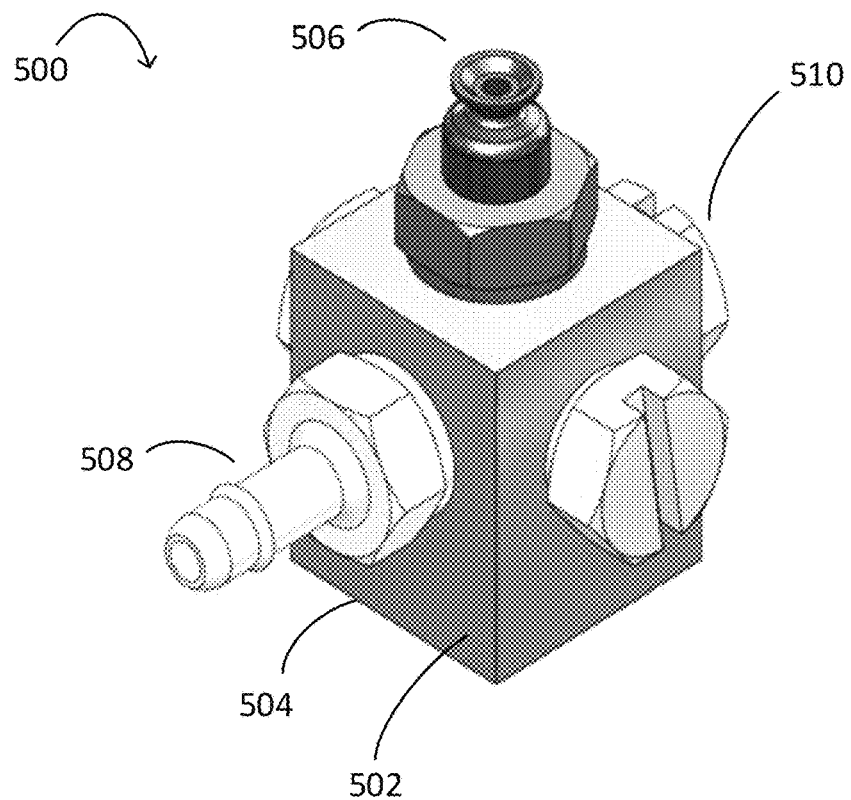
FIG. 5 is a schematic illustration of another exemplary reusable vacuum subassembly, according to some embodiments of the present disclosure.

FIG. 5 is a more detailed schematic illustration of another exemplary reusable vacuum nozzle subassembly 404 of FIG. 4, according to some embodiments of the present disclosure. As shown in FIG. 5, each of the vacuum nozzle subassemblies 500 may include a base 502, a vacuum nozzle or suction cup 506 that is operated by applying a vacuum, a vacuum hose connection 508, and, optionally, a vacuum seal 510 for maintaining a vacuum chamber within the base.

Base 502 may be any suitable size and shape, and may be based on, for example, the dimensions of base plate 402, top plate 406, and the size of vacuum nozzle 506. For example, base 502 may be cuboidal, as shown in FIG. 5, such that the subassembly 500 has four sides. Base 502 may include openings for providing vacuum connections, which may include an interchangeable vacuum hose barb 508 for attaching a hose, or an interchangeable seal 510 for sealing the opening to maintain the vacuum within the nozzle subassembly. The hose barb 508 and seal 510 may have similar dimensions to fit in the openings in the base such that the hose barb and seal are exchangeable. Base 502 may be any suitable size and shape, and made from any suitable material, as described above with respect to FIG. 2.

Base 502 of a subassembly 500 may be removably attached to base plate 402 or top plate 406 by any suitable means having the desired properties that allows for readily attaching and removing a subassembly, as described above with respect to FIG. 2. Subassembly 500 may be removably attached to a base plate and/or a top plate, for example, via a magnet or other means, which may be house in or on the bottom side of the base 504 (not visible in FIG. 5), as described above with respect to FIG. 3.

Vacuum nozzle 506 may be any suitable size and shape having the desired properties for picking up and moving a work piece using a vacuum without dropping or causing other damage to the work piece, and may be made of any suitable material, as described above with respect to FIG. 2.

Vacuum subassembly 500 is universally adjustable and reusable as the vacuum subassembly is not permanently affixed to base plate or top plate, or attached to a permanent vacuum connection. For example, vacuum subassembly may be removed and relocated on the base plate based on a different top plate configuration, as described herein, such that the nozzle subassembly configuration may be readily changed.

Figure 6:
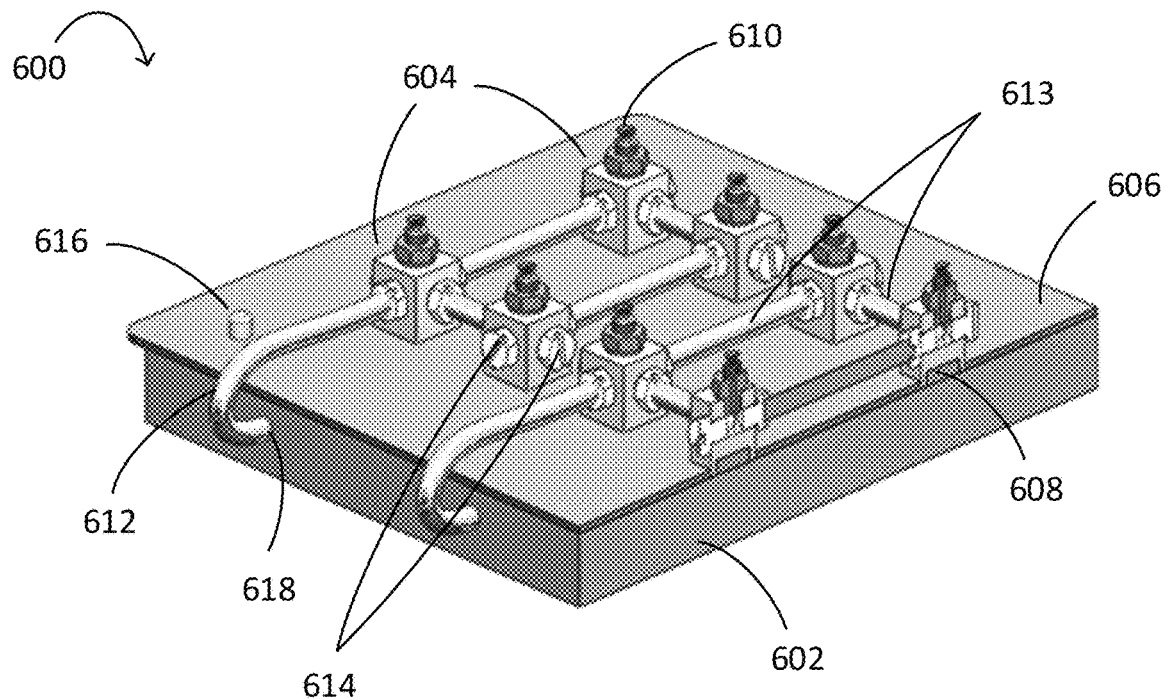
FIG. 6 is a schematic illustration of a cross-section cut away view of another exemplary reconfigurable pick and place head, according to some embodiments of the present disclosure.

FIG. 6 is a schematic illustration of a cross-section cut away view of the exemplary pick and place head of FIG. 4 having an adjustable configuration, according to some embodiments of the present disclosure. FIG. 6 illustrates assembly 600. As shown, assembly 600 includes reusable base plate 602, a plurality of reusable vacuum nozzle subassemblies 604, and top plate 606. Top plate 606 is coupled to base plate 602 using one or more screws 616. Top plate 606 has a plurality of openings for seating the vacuum nozzle subassemblies 404. Each vacuum subassembly 404 may be removably attached to the base plate, which as shown is a magnet 608, vacuum connections 612, 613, vacuum seals, 614, and vacuum nozzle 610. Each vacuum subassembly 604 is placed in a top plate opening and attached to base plate 602 via magnet 608. Vacuum connection 612 is attached to vacuum channel 618. Vacuum may be applied through vacuum connections to operate the vacuum nozzles.

Various operations will be described as multiple discrete operations, in turn, in a manner that is most helpful in understanding the present disclosure. However, the order of description should not be construed to imply that these operations are necessarily order dependent or performed only once each. In particular, these operations need not be performed in the order of presentation, and may be repeated or performed in a different order (e.g., parallel). Operations described may be performed in a different order from the described embodiment(s). Various additional operations may be performed, and/or described operations may be omitted in additional embodiments.

Figure 7:
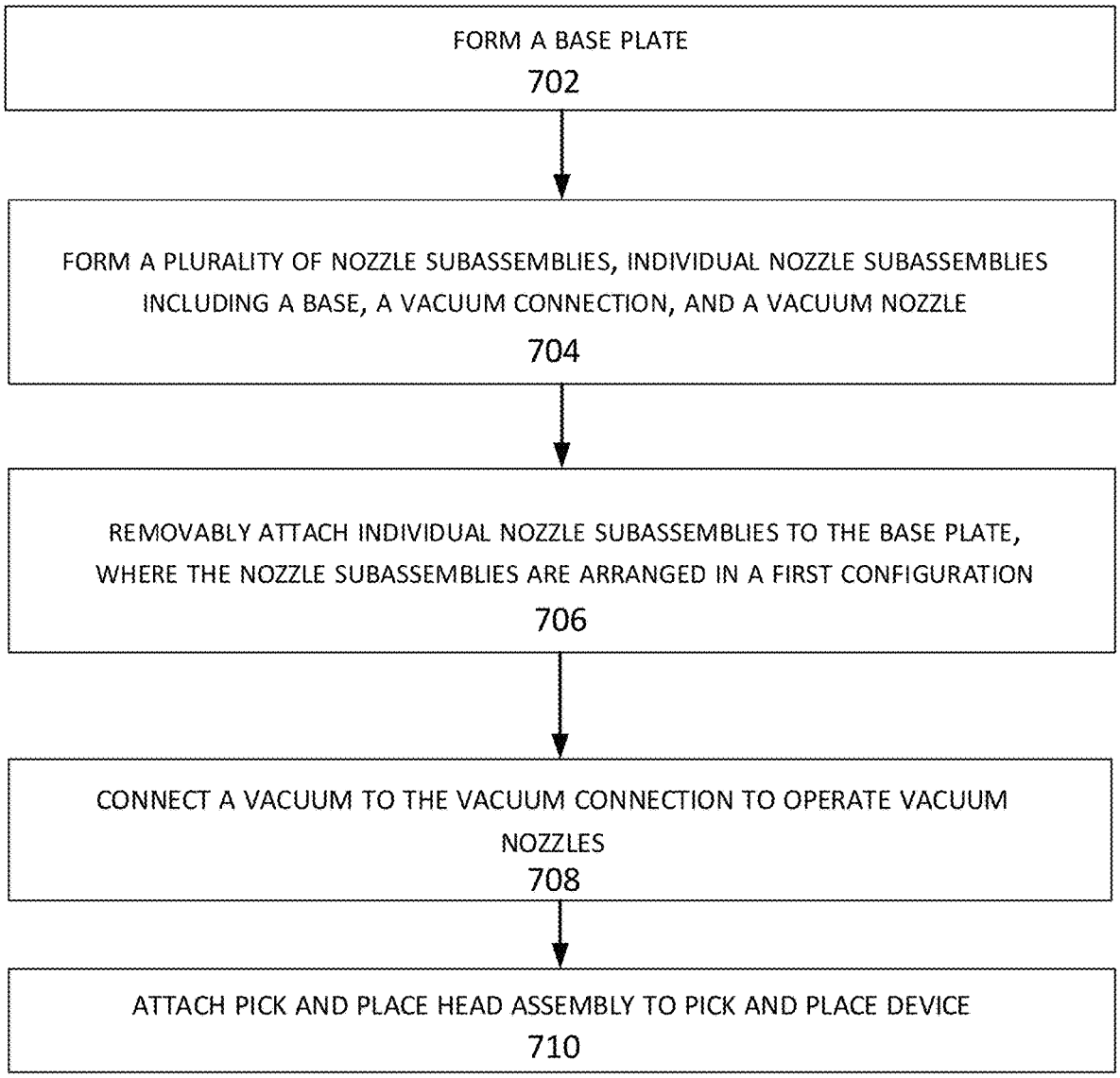
FIG. 7 is a flow diagram of an example method for fabricating an exemplary reconfigurable pick and place head, according to some embodiments of the present disclosure.

FIG. 7 is a flow diagram of an example method for fabricating an exemplary pick and place head having an adjustable nozzle configuration, according to some embodiments of the present disclosure.

At 702, form a base plate for a pick and place head. At 704, form a plurality of nozzle subassemblies, where individual nozzle subassemblies include a base, a vacuum connection, and a vacuum nozzle. At 706, removably attach individual nozzle subassemblies to the base plate, where the plurality of nozzle subassemblies is configured so that the layout (e.g., arranged so that the configuration) matches the pitch, the form factor, the tray density, and/or other requirements of the receiving tooling or tray. At 708, connect a vacuum to the vacuum connections to operate the individual vacuum nozzles. At 710, attach pick and place head assembly to pick and place device.

Figure 8A:
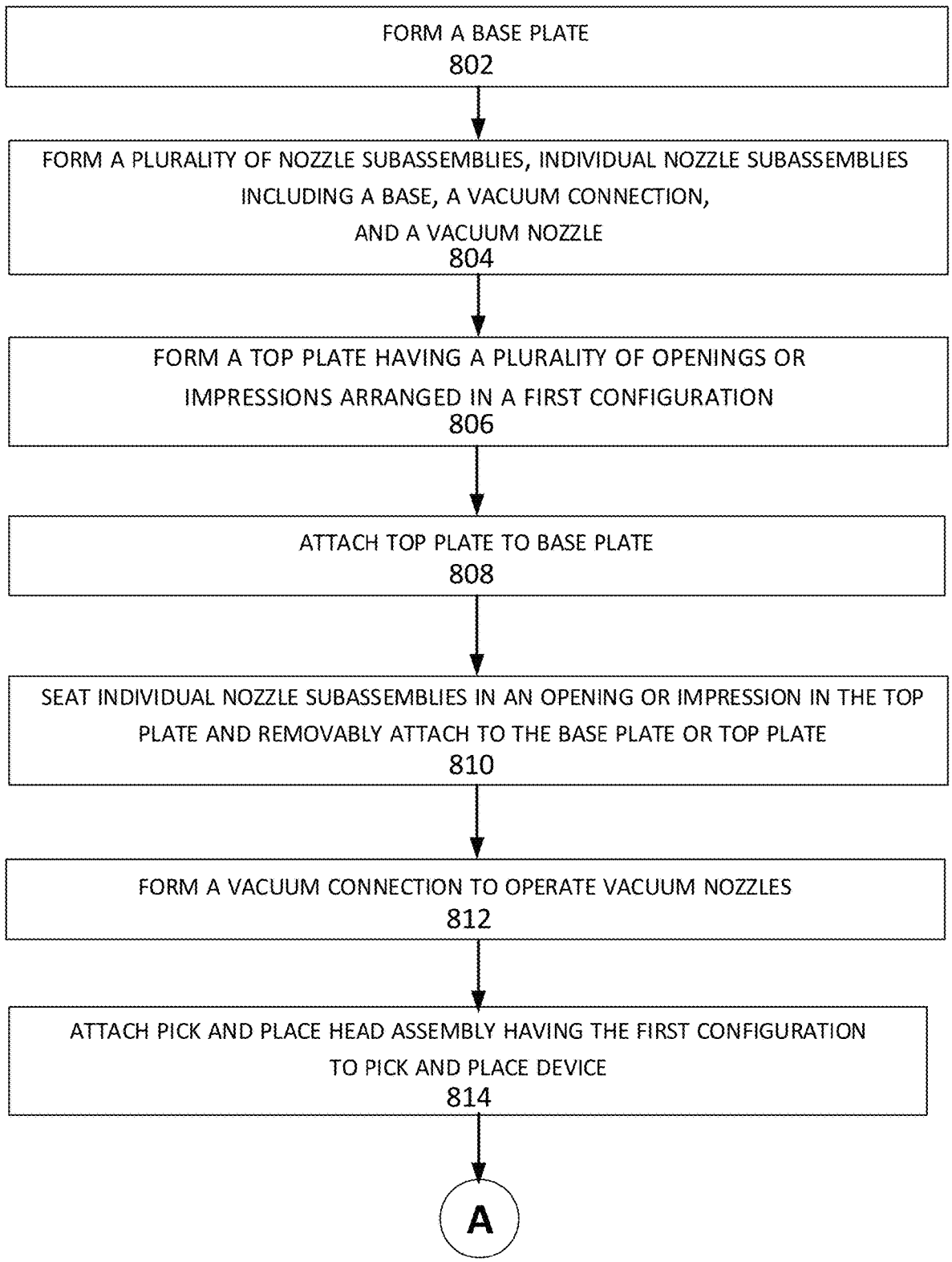
FIGS. 8A and 8B is a flow diagram of another method for fabricating an exemplary pick and place head having an adjustable configuration and a reusable vacuum subassembly, according to some embodiments of the present disclosure.
Figure 8B:
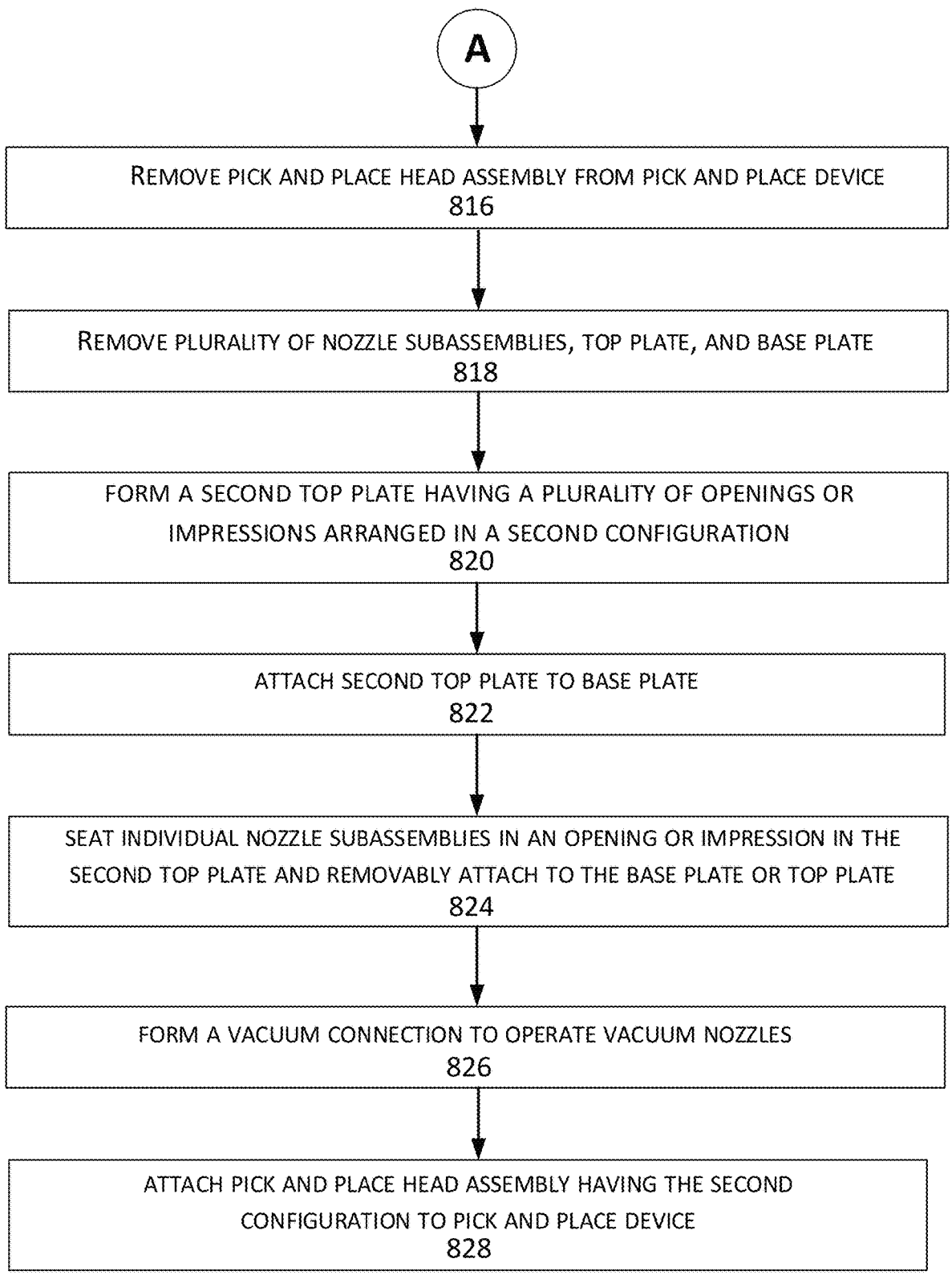

FIGS. 8A and 8B is a flow diagram of an example method for fabricating an exemplary pick and place head having an adjustable configuration, according to some embodiments of the present disclosure.

At 802, form a base plate for a pick and place head. At 804, form a plurality of nozzle subassemblies, where each nozzle subassembly includes a base, a vacuum connection, and a vacuum nozzle. At 806, form a top plate having a plurality of openings or impressions arranged in a first configuration. The first configuration may be designed based on pitch, form factor, tray density, and/or other requirements of a work piece and/or receiving tooling or tray. At 808, attach top plate to base plate. At 810, seat a nozzle subassembly in an opening or impression in the top plate and removably attach nozzle subassembly to the base plate or top plate. Repeat for all openings or impressions. At 812, form a vacuum connection to operate vacuum nozzles. At 814, attach pick and place head assembly having the first configuration to pick and place device.

At 816, remove pick and place head assembly from pick and place device. At 818, remove the plurality of nozzle subassemblies, remove the top plate, and remove the base plate. At 820, form a second top plate having a plurality of openings or impressions arranged in a second configuration. The second configuration may be designed based on pitch, form factor, tray density, and/or other requirements of a second work piece and/or second receiving tooling or tray. The second configuration may be different than the first configuration. At 822, attach the second top plate to the base plate. At 824, seat a nozzle subassembly in an opening or impression in the second top plate and removably attach nozzle subassembly to the base plate or top plate. Repeat for all openings or impressions. At 826, form a vacuum connection to operate vacuum nozzles. At 828, attach pick and place head assembly having the second configuration to pick and place device.

The following examples pertain to further embodiments. The various features of the different embodiments may be variously combined with some features included and others excluded to suit a variety of different applications.

Example 1 is a pick and place head including: a base plate; and a plurality of nozzle subassemblies removably coupled to the base plate, wherein individual nozzle subassemblies comprise a vacuum nozzle.

Example 2 may include the subject matter of Example 1, and may further include: a top plate coupled to the base plate having a plurality of openings, wherein individual nozzle subassemblies are seated in individual openings in the top plate.

Example 3 may include the subject matter of Example 2, and may further include: an internal cavity, wherein the internal cavity is defined by the base plate and the top plate when coupled; a seal for sealing the internal cavity; and a vacuum connection for coupling a vacuum to the internal cavity; and individual nozzle subassemblies may further include: a base, and an opening in the base connecting the internal cavity and the vacuum nozzle, wherein the vacuum coupled to the internal cavity operates the vacuum nozzle.

Example 4 may include the subject matter of any of Examples 1-2, and may further specify that the base plate is a solid material having bored vacuum channels and a vacuum connection for coupling a vacuum to the vacuum channels, and may further specify that individual nozzle subassemblies further include: a vacuum connection for connecting individual nozzle subassemblies to the vacuum channels.

Example 5 may include the subject matter of any of Examples 1-4, and may further specify that individual nozzle subassemblies are removably coupled to the base plate by a magnet.

Example 6 may include the subject matter of Example 2, and may further specify that the top plate material is selected from the group consisting of aluminum, aluminum alloy, plastic, steel, and steel alloy.

Example 7 may include the subject matter of Example 2, and may further specify that the top plate thickness ranges from 1 mm to 5 mm.

Example 8 may include the subject matter of any of Examples 1-7, and may further specify that the base plate thickness ranges from 5 mm to 20 mm.

Example 9 may include the subject matter of Example 4, and may further specify that the vacuum connection on individual nozzle subassemblies comprises a hose barb for connecting a vacuum hose, and may further specify that a first end of the vacuum hose is connected to the hose barb and a second end of the vacuum hose is connected to a vacuum channel on the base plate.

Example 10 may include the subject matter of Example 9, and may further specify that individual nozzle subassemblies further include: a plurality of openings on the base; and a seal, wherein the seal is exchangeable with the hose barb, and wherein individual openings on the base include the seal or the hose barb.

Example 11 may include the subject matter of Example 10, and may further specify that two or more individual nozzle subassemblies are connected to form a single connection to a vacuum channel in the base plate.

Example 12 may include the subject matter of any of Examples 1-11, and may further specify that the base plate is reusable.

Example 13 may include the subject matter of any of Examples 1-12, and may further specify that individual nozzle subassemblies are reusable.

Example 14 is a pick and place head including: a base plate; a top plate coupled to the base plate; and a plurality of nozzle subassemblies removably coupled to the top plate, wherein individual nozzle subassemblies comprise a vacuum nozzle.

Example 15 may include the subject matter of Example 14, and may further specify that the base plate is a solid material having bored vacuum channels and a vacuum connection for coupling a vacuum to the vacuum channels, and that individual nozzle subassemblies further include: a vacuum connection for connecting individual nozzle subassemblies to the vacuum channels.

Example 16 may include the subject matter of any of Examples 14-15, and may further specify that individual nozzle subassemblies are removably coupled to the top plate by a magnet.

Example 17 may include the subject matter of any of Examples 14-16, and may further specify that the top plate material is selected from the group consisting of aluminum, aluminum alloy, plastic, steel, and steel alloy.

Example 18 may include the subject matter of any of Examples 14-17, and may further specify that the top plate thickness ranges from 1 mm to 5 mm.

Example 19 may include the subject matter of any of Examples 14-18, and may further specify that the base plate thickness ranges from 5 mm to 20 mm.

Example 20 may include the subject matter of Example 15, and may further specify that the vacuum connection on individual nozzle subassemblies comprises a hose barb for connecting a vacuum hose, and that a first end of the vacuum hose is connected to the hose barb and a second end of the vacuum hose is connected to a vacuum channel on the base plate.

Example 21 may include the subject matter of Example 20, and may further specify that individual nozzle subassemblies further include: a plurality of openings on the base;

a seal, wherein the seal is exchangeable with the hose barb; and wherein individual openings on the base include the seal or the hose barb.

Example 22 may include the subject matter of Example 21, and may further specify that two or more individual nozzle subassemblies are connected to form a single connection to a vacuum channel in the base plate.

Example 23 may include the subject matter of any of Examples 14-22, and may further specify that the base plate is reusable.

Example 24 may include the subject matter of any of Examples 14-23, and may further specify that individual nozzle subassemblies are reusable.

Example 25 is a method of forming a configurable pick and place head for a pick and place device, the method including: forming a base plate; forming a plurality of nozzle subassemblies having a base, a vacuum connection, and a vacuum nozzle; removably coupling individual nozzle subassemblies to the base plate, wherein the plurality of nozzle subassemblies are arranged in a first configuration; and connecting a vacuum to individual nozzle subassembly vacuum connections to operate individual vacuum nozzles.

Example 26 may include the subject matter of Example 25, and may further include: forming a top plate comprising a plurality of openings arranged in the first configuration; coupling the top plate to the base plate; and seating individual nozzle subassemblies in individual openings on the top plate.

Example 27 may include the subject matter of any of Examples 25-26, and may further specify that individual nozzle subassemblies are removably coupled to the base plate using a magnet.

Example 28 may include the subject matter of Example 26, and may further include: removing the plurality of vacuum subassemblies; decoupling the top plate from the base plate; forming a second top plate comprising a plurality of openings arranged in a second configuration; coupling the second top plate to the base plate; and seating individual nozzle subassemblies in individual openings on the second top plate.

Example 29 may include the subject matter of any of Examples 25-28, and may further include: attaching the pick and place head to the pick and place device.

Example 30 is an apparatus including: a base plate; and a plurality of nozzle subassemblies removably coupled to the base plate, wherein individual nozzle subassemblies comprise a vacuum nozzle.

Example 31 may include the subject matter of Example 30, and may further include: a top plate coupled to the base plate having a plurality of openings, wherein individual nozzle subassemblies are seated in individual openings in the top plate.

Example 32 may include the subject matter of Example 31, and may further include: an internal cavity, wherein the internal cavity is defined by the base plate and the top plate when coupled; a seal for sealing the internal cavity; and a vacuum connection for coupling a vacuum to the internal cavity; and may further specify that individual nozzle subassemblies further include: a base, and an opening in the base connecting the internal cavity and the vacuum nozzle, wherein the vacuum coupled to the internal cavity operates the vacuum nozzle.

Example 33 may include the subject matter of any of Examples 30-31, and may further specify that the base plate is a solid material having bored vacuum channels and a vacuum connection for coupling a vacuum to the vacuum channels, and may further specify that individual nozzle subassemblies further include: a vacuum connection for connecting individual nozzle subassemblies to the vacuum channels.

Example 34 may include the subject matter of any of Examples 30-33, and may further specify that individual nozzle subassemblies are removably coupled to the base plate by a magnet.

Example 35 may include the subject matter of Example 31, and may further specify that the top plate material is selected from the group consisting of aluminum, aluminum alloy, plastic, steel, and steel alloy.

Example 36 may include the subject matter of Example 31, and may further specify that the top plate thickness ranges from 1 mm to 5 mm.

Example 37 may include the subject matter of any of Examples 30-36, and may further specify that the base plate thickness ranges from 5 mm to 20 mm.

Example 38 may include the subject matter of Example 33, and may further specify that the vacuum connection on individual nozzle subassemblies comprises a hose barb for connecting a vacuum hose, and that a first end of the vacuum hose is connected to the hose barb and a second end of the vacuum hose is connected to a vacuum channel on the base plate.

Example 39 may include the subject matter of Example 38, and may further specify that individual nozzle subassemblies further include: a plurality of openings on the base; and a seal, wherein the seal is exchangeable with the hose barb, and wherein individual openings on the base include the seal or the hose barb.

Example 40 may include the subject matter of Example 39, and may further specify that two or more individual nozzle subassemblies are connected to form a single connection to a vacuum channel in the base plate.

Example 41 may include the subject matter of any of Examples 30-40, and may further specify that the base plate is reusable.

Example 42 may include the subject matter of any of Examples 30-41, and may further specify that individual nozzle subassemblies are reusable.

Example 43 is an apparatus including: a base plate; a top plate coupled to the base plate; and a plurality of nozzle subassemblies removably coupled to the top plate, wherein individual nozzle subassemblies comprise a vacuum nozzle.

Example 44 may include the subject matter of Example 43, and may further specify that the base plate is a solid material having bored vacuum channels and a vacuum connection for coupling a vacuum to the vacuum channels, and that individual nozzle subassemblies further include: a vacuum connection for connecting individual nozzle subassemblies to the vacuum channels.

Example 45 may include the subject matter of any of Examples 43-44, and may further specify that individual nozzle subassemblies are removably coupled to the top plate by a magnet.

Example 46 may include the subject matter of any of Examples 43-45, and may further specify that the top plate material is selected from the group consisting of aluminum, aluminum alloy, plastic, steel, and steel alloy.

Example 47 may include the subject matter of any of Examples 43-46, and may further specify that the top plate thickness ranges from 1 mm to 5 mm.

Example 48 may include the subject matter of any of Examples 43-47, and may further specify that the base plate thickness ranges from 5 mm to 20 mm.

Example 49 may include the subject matter of Example 44, and may further specify that the vacuum connection on individual nozzle subassemblies comprises a hose barb for connecting a vacuum hose, and that a first end of the vacuum hose is connected to the hose barb and a second end of the vacuum hose is connected to a vacuum channel on the base plate.

Example 50 may include the subject matter of Example 49, and may further specify that individual nozzle subassemblies further include: a plurality of openings on the base; a seal, wherein the seal is exchangeable with the hose barb; and wherein individual openings on the base include the seal or the hose barb.

Example 51 may include the subject matter of Example 50, and may further specify that two or more individual nozzle subassemblies are connected to form a single connection to a vacuum channel in the base plate.

Example 52 may include the subject matter of any of Examples 43-51, and may further specify that the base plate is reusable.

Example 53 may include the subject matter of any of Examples 43-52, and may further specify that individual nozzle subassemblies are reusable.

The invention claimed is:

1. A pick and place head comprising:
   a base plate, wherein the base plate is a solid material having bored vacuum channels and a vacuum connection for coupling a vacuum to the vacuum channels; and
   a plurality of nozzle subassemblies removably coupled to the base plate, wherein individual nozzle subassemblies comprise a vacuum nozzle and a hose barb for connecting a vacuum hose, wherein a first end of the vacuum hose is connected to the hose barb and a second end of the vacuum hose is connected to a vacuum channel on the base plate.

2. The pick and place head of claim 1, further comprising:
   a top plate coupled to the base plate having a plurality of openings, wherein individual nozzle subassemblies are seated in individual openings in the top plate.

3. The pick and place head of claim 2, wherein the top plate material is selected from the group consisting of aluminum, aluminum alloy, plastic, steel, and steel alloy.

4. The pick and place head of claim 1, wherein individual nozzle subassemblies are removably coupled to the base plate by a magnet.

5. The pick and place head of claim 1, wherein individual nozzle subassemblies further comprise:
   a plurality of openings on the base; and
   a seal, wherein the seal is exchangeable with the hose barb, and
   wherein individual openings on the base include the seal or the hose barb.

6. The pick and place head of claim 1, wherein the base plate is reusable.

7. The pick and place head of claim 1, wherein individual nozzle subassemblies are reusable.

* * * * *